United States Patent [19]

Kaindl et al.

[11] Patent Number: 4,801,916
[45] Date of Patent: Jan. 31, 1989

[54] VERTICAL PLUG-IN SINGLE-IN-LINE CIRCUIT MODULE

[75] Inventors: Michael Kaindl, Pfaffenhofen; Werner Piepenburg; Ernst Vollmerhaus, both of Munich, all of Fed. Rep. of Germany

[73] Assignee: Siemens Aktiengesellschaft, Berlin and Munich, Fed. Rep. of Germany

[21] Appl. No.: 121,007

[22] Filed: Nov. 16, 1987

[30] Foreign Application Priority Data

Nov. 28, 1986 [DE] Fed. Rep. of Germany ....... 3640694

[51] Int. Cl.[4] ............................................. H01C 13/00
[52] U.S. Cl. .................................. 338/221; 338/217; 361/406; 361/417
[58] Field of Search ............... 338/220, 221, 217, 138; 361/406, 404, 405, 408, 417, 419, 420

[56] References Cited

U.S. PATENT DOCUMENTS 2,691,716 10/1954 Wellens ................................ 338/221
2,978,664 4/1961 Walters ................................. 338/217
4,118,112 10/1978 Thornburg ........................... 338/217

FOREIGN PATENT DOCUMENTS 2655841 12/1976 Fed. Rep. of Germany ...... 338/221

Primary Examiner—C. L. Albritton
Attorney, Agent, or Firm—James G. Morrow

[57] ABSTRACT

A vertical plug-in single-in-line circuit module with a carrier for carrying a row of single-in-line mounted metal pins lying in the plane of the carrier along one carrier edge as outer electrical connections of one or more resistive elements such as a resistance area or resistance path. A first region of the resistive element is located closer to the metal pins of the carrier than a second region of the resistive element. Leads couple the metal pins to the resistive element. The first region lying closest to the metal pins is so constructed that it sees a higher heat dissipation per unit surface area during operation than the second region. The leads are connected to the resistive element such that the current can flow between the first region and second region.

15 Claims, 3 Drawing Sheets

VERTICAL PLUG-IN SINGLE-IN-LINE CIRCUIT MODULE

BACKGROUND OF THE INVENTION

This invention relates to a vertical plug-in single-in-line circuit module, and, more particularly, this invention relates to an improvement to a vertical plug-in circuit module for dissipating heat from an electrical component on the circuit module.

Vertical plug-in circuit modules are known in the art, and it is also known that there are various problems associated with these circuit modules. An important problem associated with these circuit modules is the dissipation of heat energy from the components located on these circuit modules.

Normally a circuit module includes a carrier composed of a ceramic. Components such as film resistors are located upon the carrier. When electrical power is supplied to the resistors the carrier is locally heated most intensely adjacent to the resistors. Depending on the heat conductivity of the carrier, the heat is conducted away from the resistor at a certain rate. This heat can be dissipated from the carrier and the resistor via cooling air. However, since the thermal conductivity of the carrier and the heat dissipating ability of the cooling air are limited, the resistor and adjacent area of the carrier can experience very high local temperatures under conditions when heat can not be dissipated at a sufficient rate. These conditions can include obstruction of air flow, increases in power supplied to the resistor and high ambient air temperatures. This intense local heating of the carrier can induce unsatisfactory temperature gradients in the carrier which results in thermal stresses in the carrier which can crack the carrier. Also, the heating and cooling cycles to which the carrier is exposed can cause thermal fatigue of the carrier.

One way of dealing with the heat dissipation problem is to add a plate having good heat conduction characteristics, to one side of the carrier. Metalic plates such as an aluminum plate have been used for this purpose. Aluminum has a heat conductivity over ten times better than many ceramic carriers, therefore it is a desirable material. Favorable heat dissipation is achieved using plates, and this results in lower temperature gradients along the carrier.

In light of the foregoing, it can be appreciated that heat dissipation from a plug-in circuit module is a problem and that the use of a metal plate may not be a satisfactory solution where cost and size considerations are important.

SUMMARY OF THE INVENTION

The invention is directed to a plug-in circuit module for use in a current supply system. This type of circuit module is particularly useful when used with resistance elements, such as resistive film areas, which serve as feed resistances or subscriber lines of a digital telephone switching system. In some situations it is desirable that the circuit module carry additional components such as capacitors and safety fuses. The circuit modules are normally housed in cabinets, in close proximity and in very large numbers (100,000 modules). The cooling of these circuit modules creates substantial problems at times of high switching activity, and at times, such as mid-summer, when there are very high ambient temperatures.

Accordingly, the present invention is directed to a plug-in circuit module supported above a base, wherein the circuit module is configured to enhance heat dissipation. The circuit module includes a carrier for supporting electronic components, such as resistive elements, which are fixed to the carrier. The electronic components include a first connection region and a second connection region. The electronic components are designed such that the amount of heat produced in the electronic component in the first connection region is greater than the amount of heat produced in the second connection region. A first conductive means, such as a lead, is adapted for connection to each electronic component at the first connection region and is adapted to conduct heat and electricity between the first connection region and the base.

The heat produced in the connection regions is adjusted by adjusting the resistance in these regions. The resistance can be adjusted by adjusting the cross-sectional area of these regions and by adjusting the resistivity of the material in these regions. To adjust the cross-sectional area of the connection regions, either the width or thickness alone or in combination can be adjusted.

One object of the present invention is to provide an arrangement for supporting a circuit component on a carrier such that the fabrication cost of the plug-in circuit module can be reduced and the size of the plug-in circuit module can also be reduced so that space can be conserved in the application of the circuit module. Another object of the invention is to produce an arrangement for supporting a circuit component on a carrier such that the overall temperature of the carrier and component does not reach critical levels. Another object of the invention is to produce an arrangement for supporting a circuit component on a carrier such that the localized heating of the carrier and temperature gradients in the carrier are reduced. Still another object of the invention is to provide for a small circuit module having a high thermal load capacity which is suitable for high quantity production.

One advantage of the invention is that it greatly reduces the need to increase the surface area of circuit components for purposes of heat dissipation, it reduces the need for additional stiffening means to prevent cracking in the carrier and it reduces the need for metallic plates on the carrier and/or cooling means such as fins.

Various other objects and advantages of the present invention will become apparent from the following description, with reference to the accompanying drawings.

DETAILED DESCRIPTION OF THE PREFERRED EMBODIMENT

Figure 1:
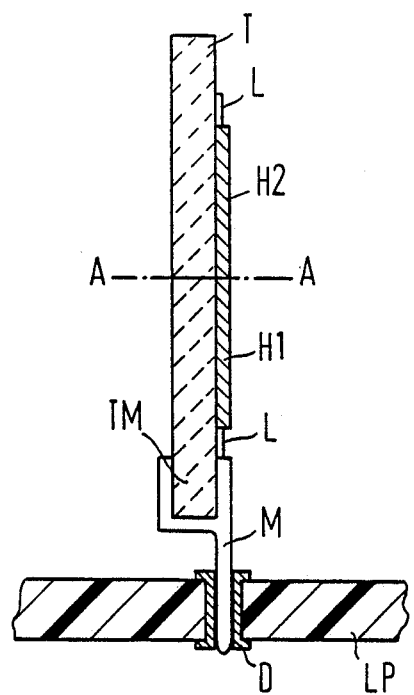
FIG. 1 is a sectional view taken along line I—I of FIG. 2.

Turning now to the drawings, FIG. 1 illustrates a resistive element H1/H2; such as a film resistor, resistive path or resistive area; fixed to a ceramic carrier T. The carrier T carries a row of metal pins M, at the bottom of the carrier T, as electrical connections. The metal pins M are connectable at inserts D of the perforated base plate LP. The carrier T may carry one or several such resistive elements H1/H2.

Figure 2:
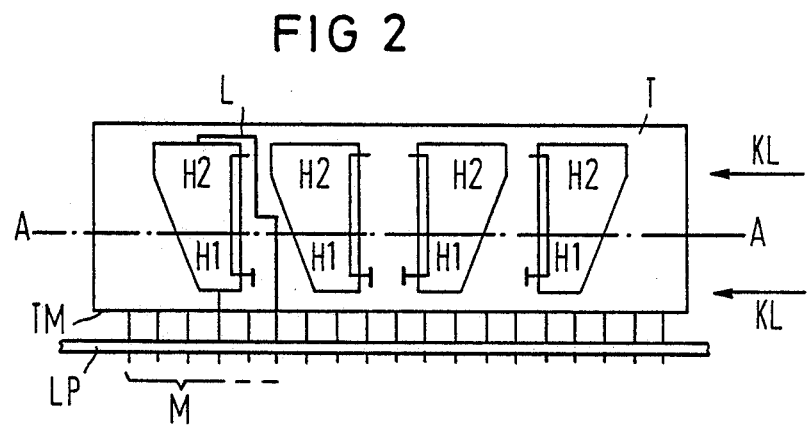
FIG. 2 is a side view of the vertical plug-in single-in-line circuit module with carrier.
Figure 3:
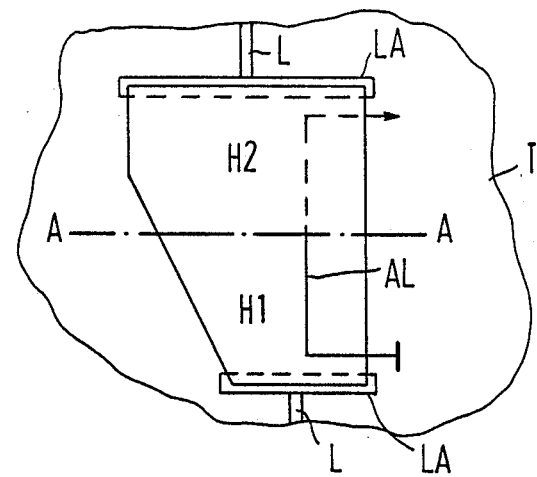
FIG. 3 is an exploded side view of one embodiment of the resistive element.
Figure 4:
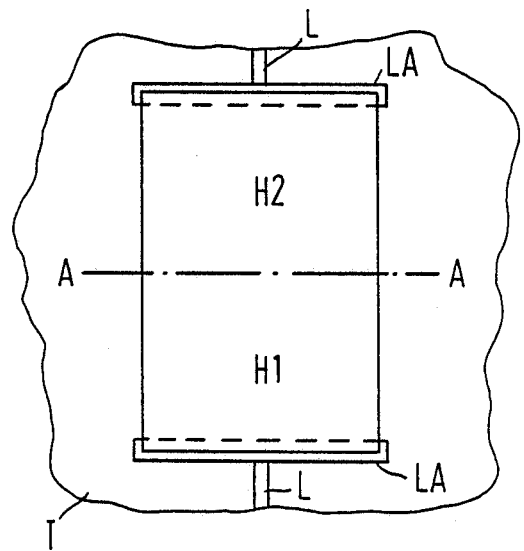
FIG. 4 is an exploded side view of another embodiment of the resistive element.
Figure 5:
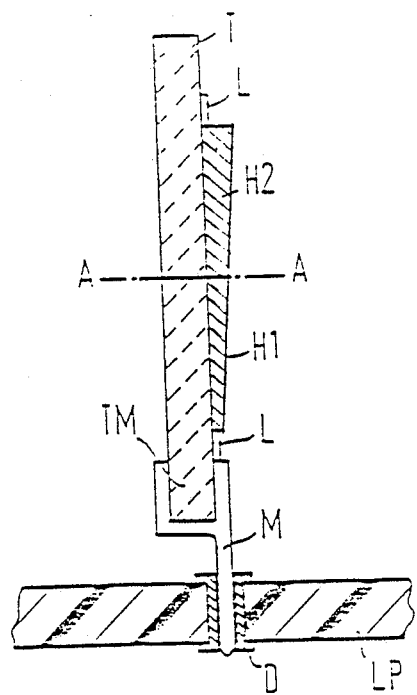
FIG. 5 is an end view of the resistive element illustrated in FIG. 4.

As illustrated in FIGS. 1-5, the resistive element H1/H2 is made up of a first region H1 and a second region H2. In FIGS. 3 and 4, which are more detailed illustrations of the resistive elements H1/H2, a first conducting resistor contact section LA is located at the bottom of the first region H1 and a second conducting resistor contact section LA is located at the top of second region H2. Each of the contact sections LA is connected to a lead L. One of the leads L is connected to a metal pin M and the contact section LA located at the bottom of the first region H1. The first region H1 is located very close to the metal pins M and the carrier edge TM The second region H2 is above the first region H1 and, accordingly, is further from the metal pins M. The second region H2 is in electrical connection with the first region H1 and blends into the first region H1. The resistive element is broken into a first region H1 and second region H2 by reference line A—A for purposes of discussion.

In the preferred embodiment of the circuit module a noticeable portion of heat produced in the resistive elements H1/H2 is conducted away from the resistive elements H1/H2 by means of the leads L and metal pins M. This heat is in turn conducted by the metal pins M to the inserts D and the perforated base plate LP. This form of heat dissipation from the resistive elements H1/H2 often even is more reliable, for purposes of cooling the first region H1, than directing cooling air. When a cooling air stream KL is forced past the resistive elements H1/H2, as illustrated in FIG. 2, the different air resistances at the first region H1 and second region H2 are such that the cooling air stream KL is more effective in cooling the second region H2.

The heat conduction from the resistive element H1/H2 through the lead L and metal pin M adds additional cooling to the resistive element H1/H2 such that even more heat can be removed from the first region H1 than the second region H2. Since more heat can be removed from the first region H1 it is desirable to use a resistive element H1/H2 having a greater electrical resistance in the first region H1 than in the second region H2. The combination of the resistances in the two regions H1 and H2 produces the total resistance of the resistive element H1/H2.

The rate of heat generation in these regions H1, H2 is modeled by the equation $P=I^2R$ (P=heat/unit time, I=current and R=resistance). From this equation it can be seen that the rate of heat generation is proportional to resistance. Thus, it can be seen that the rate of heat generation can be substantially matched to the regions H1,H2 by adjusting the resistance of each region H1,H2 accordingly, since current I in the first region H1 equals the current I in the second region H2.

One way to vary the resistance of the regions H1,H2 is to vary the cross-sectional area of the resistive element H1/H2 along planes parallel to the line A—A. The cross-sectional area can be varied in a number of ways. In one embodiment of the resistive element the cross-sectional area, and thereby the resistance of the resistive element H1/H2, is decreased from the second region H2 to the first region H1 by decreasing the width of the resistive element H1/H2. (See FIG. 3.) In another embodiment of the resistive element, the cross-sectional area is decreased from the second region H2 to the first region H1 by decreasing the thickness. (See FIGS. 4 and 5.) A combination of varying thickness and width can also be used to vary the cross-sectional area.

Another way to vary the resistance of the regions H1, H2 is to vary the resistivity of the regions' material making up the resistive element H1/H2.

By increasing the resistivity of the resistive element H1/H2 in the first region H1, the region H1 of the resistive element having the greatest rate of heat generation will be brought as close as possible to the heat dissipating and thermal conducting leads L and metal pins M.

Even though the invention is not limited to a particular fabrication technology, the resistive element H1/H2 can be fabricated by thick film and thin film techniques. Using thick film screen printing techniques the thickness of the resistive element H1/H2 can be increased from the first region H1 to the second region H2 through multiple printing of resistance paste layers during which the next higher paste layer is printed after adequate hardening and drying of the lower layers. (See FIG. 5.) A variable thickness resistive element H1/H2 can also be fabricated using thin film vacuum evaporation or sputtering techniques using longer or multiple steps of evaporation or sputtering of a resistive layer while implementing appropriate masking.

Once the variable resistance resistive element H1/H2 is fabricated, the resistance of this element H1/H2 can be precisely adjusted by partially or entirely separating a section of the element H1/H2 with a directed laser beam. FIG. 3 illustrates, as an example, a path AL, indicated by an arrow, along which a laser could separate a section of the element H1/H2. The laser can be used until the measured resistive value of the element H1/H2 matches the required value. (Also see FIG. 2.) If the path of the laser beam is allowed to start in the first region H1, the resistance of first region H1 is gradually increased in relation to the resistance of the second region H2. The resistance of the regions H1/H2 having shapes different than that shown in FIG. 3 may also be adjusted using a laser beam in a similar manner. For example, the resistance of the regions H1/H2 of the resistive element H1/H2 illustrated in FIG. 4 could be adjusted using a laser beam following an appropriate path.

While two embodiments of the resistive element are shown and described, various other changes and modifications may be made without department from the scope of the present invention.

We claim:

1. A plug-in circuit module supportable above a base, comprising:
    a carrier for supporting electronic components;
    an electronic component fixed to the carrier and including a first connection region and a second connection region, wherein the electronic component is designed such that the amount of heat produced in the electronic component at the first connection region is greater than the amount of heat produced at the second connection region;

a first conducting means for connection to the electronic component at the first connection region and adapted to conduct heat between the first connection region and the base; and a second conductive means for connection to the electronic component at the second connection region.

2. The plug-in circuit module of claim 1 wherein the electronic component is a resistor.

3. The plug-in circuit module of claim 2 wherein the cross-section of the resistor is smaller at the first connection region than at the second connection region.

4. The plug-in circuit module of claim 2 wherein the width of the resistor is smaller at the first connection region than at the second connection region.

5. The plug-in circuit module of claim 2 wherein the thickness of the resistor is smaller at the first connection region than at the second connection region.

6. The plug-in circuit module of claim 2 wherein the resistivity of the resistor is greater in the first connection region than in the second connection region.

7. The plug-in circuit module of claim 3, wherein the first conductive means comprises a first lead and a first resistor contact section, the resistor contact section being in contact with the resistor and the lead being in contact with the resistor contact section.

8. The plug-in circuit module of claim 7, wherein the second conductive means comprises a second lead and a second resistor contact section, the second resistor contact section being in contact with the resistor and the second lead being in contact with the second resistor contact section.

9. A plug-in single-in-line circuit module supportable above a base comprising:

a carrier for supporting electronic components;

at least one resistive element fixed to the carrier and including a first connection region and a second connection region, wherein the cross-section of the resistive element is smaller at the first connection region than at the second connection region and the amount of heat produced at the first connection region is greater than the amount of heat produced at the second connection region;

a first conductive means for connection to the resistive element at the first connection region and adapted to conduct heat between the first connection region and the base; and a second conductive means for connection to the resistive element at the second connection region.

10. The plug-in circuit module of claim 9 wherein the width of the resistive element is smaller in the first connection region than in the second connection region.

11. The plug-in circuit module of claim 9 wherein the thickness of the resistive element is smaller in the first connection region than in the second connection region.

12. The plug-in circuit module of claim 10, wherein the first conductive means comprises a first lead and a first resistor contact section, the resistor contact section being in contact with the resistive element and the lead being in contact with the resistor contact section.

13. The plug-in circuit module of claim 12, wherein the second conductive means comprises a second lead and a second resistor contact section, the second resistor contact section being in contact with the resistive element and the second lead being in contact with the second resistor contact section 1.

14. The plug-in circuit module of claim 11, wherein the first conductive means comprises a first lead and a first resistor contact section, the resistor contact section being in contact with the resistive element and the lead being in contact with the resistor contact section.

15. The plug-in circuit module of claim 14, wherein the second conductive means comprises a second lead and a second resistor contact section, the second resistor contact section being in contact with the resistor and the second lead being in contact with the second resistor contact section.

* * * * *